(12) United States Patent
Shvach et al.

(10) Patent No.: US 7,253,602 B2
(45) Date of Patent: *Aug. 7, 2007

(54) SELF-POWERED POWER BUS SENSOR EMPLOYING WIRELESS COMMUNICATION

(75) Inventors: Randal P. Shvach, Conway, PA (US); Joseph J. Matsko, Beaver, PA (US); Mark G. Solveson, Oconomowoc, WI (US); Charles J. Luebke, Sussex, WI (US); Joseph C. Engel, Monroeville, PA (US)

(73) Assignee: Eaton Corporation, Cleveland, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/038,899

(22) Filed: Jan. 19, 2005

(65) Prior Publication Data

US 2006/0076946 A1  Apr. 13, 2006

Related U.S. Application Data

(63) Continuation-in-part of application No. 10/962,682, filed on Oct. 12, 2004, now Pat. No. 7,145,322.

(51) Int. Cl.
*G01R 15/18* (2006.01)
*G01R 15/20* (2006.01)
*G01R 33/07* (2006.01)
*G01R 19/20* (2006.01)

(52) U.S. Cl. ............... 324/127; 324/117 H; 324/117 R

(58) Field of Classification Search ............ 324/117 H, 324/127, 117 R, 96, 126; 340/870.01–870.02
See application file for complete search history.

(56) References Cited

U.S. PATENT DOCUMENTS

| 4,587,509 | A | | 5/1986 | Pitt et al. |
| 4,616,207 | A | | 10/1986 | Knapp, Jr. et al. |
| 4,801,937 | A | * | 1/1989 | Fernandes ............... 340/870.16 |

(Continued)

OTHER PUBLICATIONS

National Semiconductor Corporation, "LM35 Precision Centigrade Temperature Sensors", Nov. 2000, pp. 1-13.

*Primary Examiner*—Ernest Karlsen
*Assistant Examiner*—Roberto Velez
(74) *Attorney, Agent, or Firm*—Martin J. Moran

(57) ABSTRACT

A sensor apparatus is for a power bus including a plurality of characteristics. The sensor apparatus includes a housing; one or more sensors each adapted to sense a characteristic of the power bus; and a circuit adapted to transmit or receive a wireless signal. A processor includes a low-power mode and a routine adapted to wake up from the low-power mode, to input the sensed characteristic from the one or more sensors, to output a corresponding signal to the circuit to transmit as the wireless signal, and to sleep in the low-power mode. A power supply is adapted to power the sensors, the circuit and the processor from flux arising from current flowing in the power bus. The power supply includes one or more voltages.

3 Claims, 10 Drawing Sheets

U.S. PATENT DOCUMENTS

| | | | |
|---|---|---|---|
| 4,855,671 A * | 8/1989 | Fernandes | 324/127 |
| 5,349,162 A | 9/1994 | Holling | |
| 5,541,516 A * | 7/1996 | Rider et al. | 324/326 |
| 5,565,783 A * | 10/1996 | Lau et al. | 324/522 |
| 6,014,083 A * | 1/2000 | Bauerschmidt et al. | 340/635 |
| 6,043,461 A | 3/2000 | Holling et al. | |
| 6,084,522 A | 7/2000 | Addy | |
| 6,087,800 A * | 7/2000 | Becker et al. | 318/778 |
| 6,130,599 A | 10/2000 | Juds et al. | |
| 6,271,656 B1 | 8/2001 | Juds et al. | |
| 6,590,386 B1 * | 7/2003 | Williams | 324/178 |
| 6,628,496 B2 | 9/2003 | Montjean | |
| 6,642,704 B2 * | 11/2003 | Hastings et al. | 324/117 H |
| 6,731,105 B1 | 5/2004 | Hoyle et al. | |
| 7,053,601 B1 * | 5/2006 | Fenske et al. | 324/127 |
| 7,091,850 B2 * | 8/2006 | Katz | 340/539.1 |
| 2002/0085689 A1 * | 7/2002 | Chin | 379/88.13 |
| 2006/0077037 A1 * | 4/2006 | Luo et al. | 340/5.72 |
| 2006/0100002 A1 * | 5/2006 | Luebke et al. | 455/574 |

* cited by examiner

SELF-POWERED POWER BUS SENSOR EMPLOYING WIRELESS COMMUNICATION

This is a continuation-in-part of application Ser. No. 10/962,682, filed Oct. 12, 2004, now U.S. Pat. No. 7,145,322, and entitled "Self-Powered Power Bus Sensor Employing Wireless Communication".

BACKGROUND OF THE INVENTION

1. Field of the Invention

This invention pertains generally to sensors for switchgear and, more particularly, to such sensors for a power bus.

2. Background Information

Electrical sensors of various types are used to detect the current flowing through a conductor. Such sensors include, for example, a single Hall effect sensor that produces an output voltage indicative of the current magnitude as well as more conventional current sensors such as a shunt resistor.

Hall effect devices have been used to sense variations in magnetic flux resulting from a flow of current through a conductor. Some of these known devices have used a flux concentrator to concentrate magnetic flux emanating from the flow of current through the conductor. It has previously been suggested that electrical current sensing apparatus could be constructed in the manner disclosed in U.S. Pat. Nos. 4,587,509; and 4,616,207.

It is also known to measure the current in a conductor with one or two appropriately placed Hall sensors that measure flux density near the conductor and to convert the same to a signal proportional to current. See, for example, U.S. Pat. Nos. 6,130,599; 6,271,656; 6,642,704; and 6,731,105.

Non-conventional current sensors that employ a pair of magnetic field detectors have special requirements. One of these requirements is that the magnetic field detectors are parallel to one another. Another requirement may be that the corresponding electronic circuit card is disposed as closely as possible to the magnetic field detectors for purposes such as packaging, convenience and noise suppression. Furthermore, it may be advantageous to provide a current sensor assembly that can be mounted to conductors having various sizes and shapes.

U.S. Pat. No. 6,642,704 discloses a current sensor assembly that maintains a pair of magnetic field detectors parallel to one another and closely disposed to an electronic circuit card. Furthermore, the magnetic field detectors are selectively adjustable in order to be attached to a variety of electrical power conductors.

There exists the need for switchgear devices to safely provide electrical isolation and reliably determine, for example, the temperature and/or the current of the power busses thereof.

Accordingly, there is room for improvement in sensors for switchgear or power busses.

SUMMARY OF THE INVENTION

These needs and others are met by the present invention, which provides a self-powered power bus sensor that employs wireless communication for electrical isolation.

In accordance with one aspect of the invention, a sensor apparatus for a power bus including a plurality of characteristics comprises: a housing; at least one sensor, each of the at least one sensor being adapted to sense a characteristic of the power bus; a circuit adapted to at least transmit a wireless signal; a processor comprising a low-power mode and a routine adapted to wake up from the low-power mode, to input the sensed characteristic of the power bus from the at least one sensor, to output a corresponding signal to the circuit to transmit as the wireless signal, and to sleep in the low-power mode; and a power supply adapted to power the at least one sensor, the circuit and the processor from flux arising from current flowing in the power bus, the power supply including at least one voltage.

The power supply may comprise a coil including an output having an alternating current voltage, a voltage multiplier circuit including an input electrically interconnected with the output of the coil and an output having a direct current voltage, and a voltage regulator including at least one output having the at least one voltage.

The power supply may further comprise a circuit adapted to monitor the output having the direct current voltage and disable the voltage regulator when the direct current voltage is below a predetermined value.

The routine may be further adapted to determine a power on initialization state of the processor and to responsively input the sensed characteristic of the power bus from the at least one sensor and output the corresponding signal to the circuit to transmit as the wireless signal before sleeping in the low-power mode, and, otherwise, to sleep in the low-power mode before inputting the sensed characteristic of the power bus from the at least one sensor and outputting the corresponding signal to the circuit to transmit as the wireless signal before sleeping again in the low-power mode.

The power supply may further comprise a circuit adapted to monitor the output having the direct current voltage and disable the voltage regulator when the direct current voltage is below a predetermined value. The processor may be adapted to wake up from the low-power mode after a predetermined time interval.

The routine may be further adapted to sleep in the low-power mode after (a) waking up from the low-power mode and after (b) outputting as the corresponding signal a single corresponding signal to the circuit to transmit as a single wireless signal.

The routine may be further adapted to sleep in the low-power mode after (a) waking up from the low-power mode, after (b) inputting a first sensed characteristic of the power bus from the at least one sensor, after (c) outputting a first corresponding signal to the circuit to transmit as a first wireless signal, after (d) inputting a second sensed characteristic of the power bus from the at least one sensor, and after (e) outputting a second corresponding signal to the circuit to transmit as a second wireless signal.

The circuit may be adapted to transmit the wireless signal as a remote keyless entry frequency shift keying radio frequency signal.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

As employed herein the term "antenna" shall expressly include, but not be limited by, any structure adapted to radiate and/or to receive electromagnetic waves, such as, for example, radio frequency signals.

As employed herein the term "switchgear device" shall expressly include, but not be limited by, a circuit interrupter, such as a circuit breaker (e.g., without limitation, low-voltage or medium-voltage or high-voltage); a motor controller/starter; and/or any suitable device which carries or transfers current from one place to another.

As employed herein the term "power bus" shall expressly include, but not be limited by, a power conductor; a power bus bar; and/or a power bus structure for a circuit interrupter.

As employed herein, the term "wireless" means without a wire, without an electrical conductor and without an optical fiber or waveguide.

As employed herein, the term "wireless signal" means a radio frequency signal, an infrared signal or another suitable visible or invisible light signal that is transmitted and/or received without a wire, without an electrical conductor and without an optical fiber or waveguide.

As employed herein, the term "low-rate wireless signal" means IrDA, Bluetooth, and other suitable radio frequency, infrared, or other light, wireless communication protocols or wireless signals.

As employed herein, the statement that two or more parts are "connected" or "coupled" together shall mean that the parts are joined together either directly or joined through one or more intermediate parts. Further, as employed herein, the statement that two or more parts are "attached" shall mean that the parts are joined together directly.

The present invention is described in association with a temperature sensor and/or a current sensor for a power bus bar, although the invention is applicable to a wide range of sensors for power busses.

Figure 1:
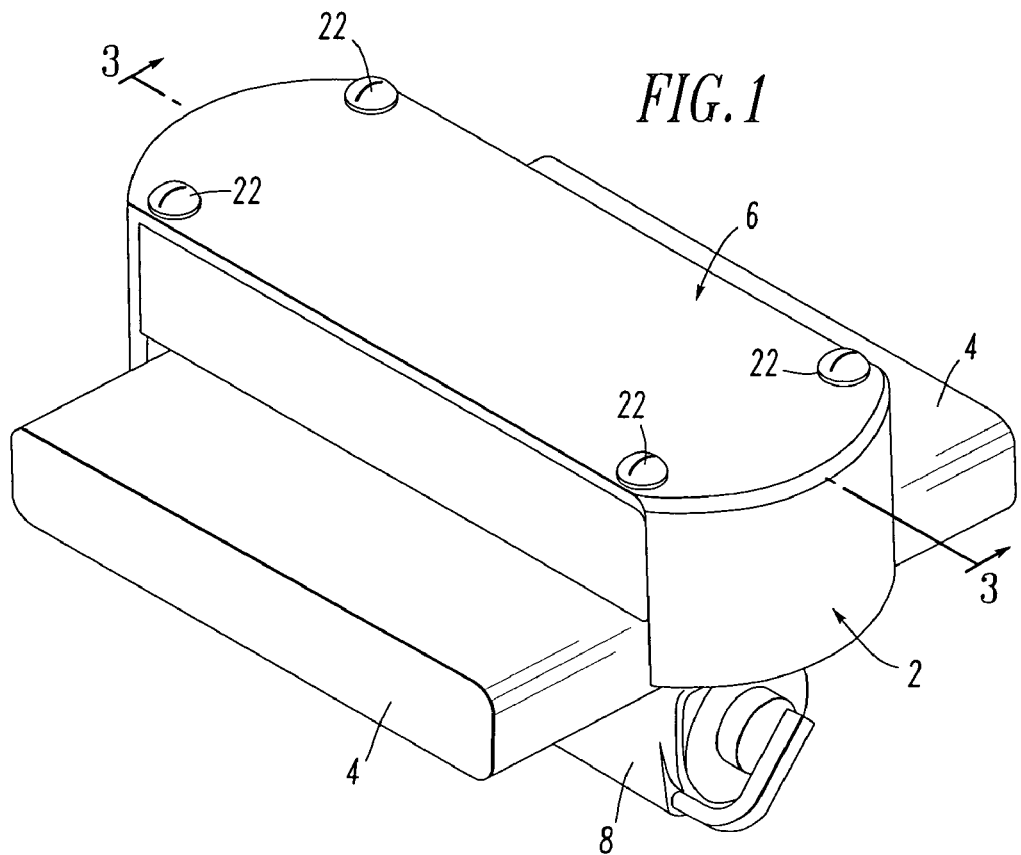
FIG. 1 is an isometric view of a self-powered wireless power bus temperature sensor in accordance with the present invention.
Figure 3:
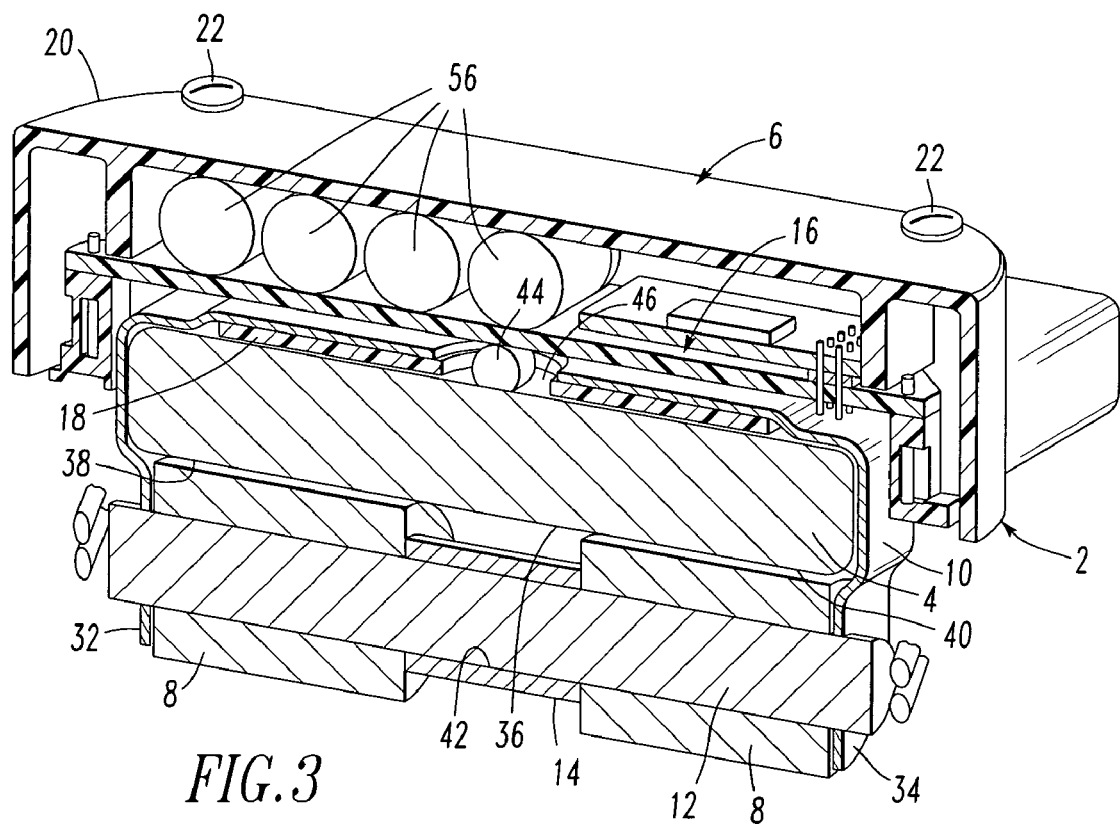
FIG. 3 is a cross sectional view along lines 3-3 of FIG. 1.
Figure 2:
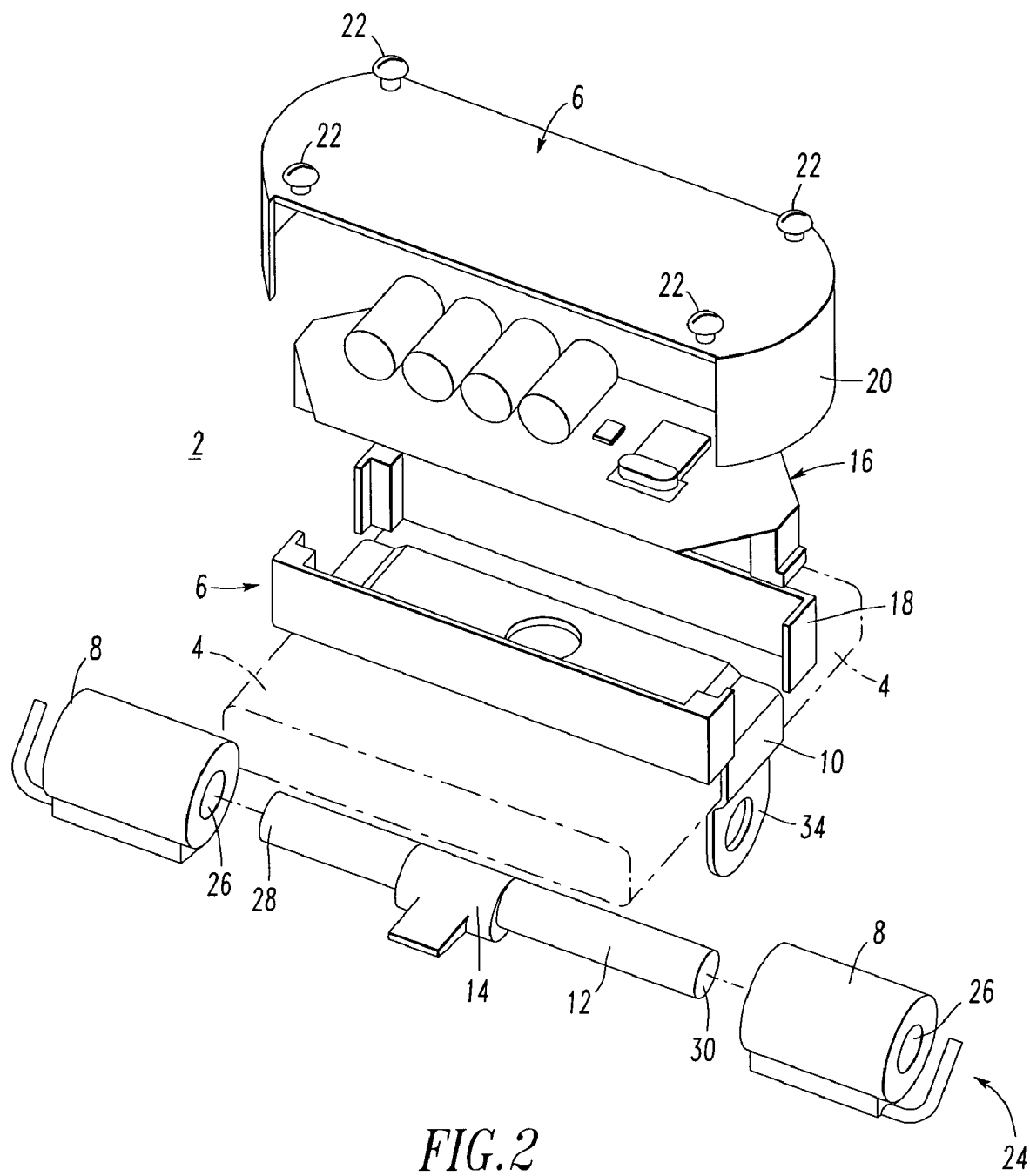
FIG. 2 is an exploded isometric view of the temperature sensor of FIG. 1.
Figure 5:
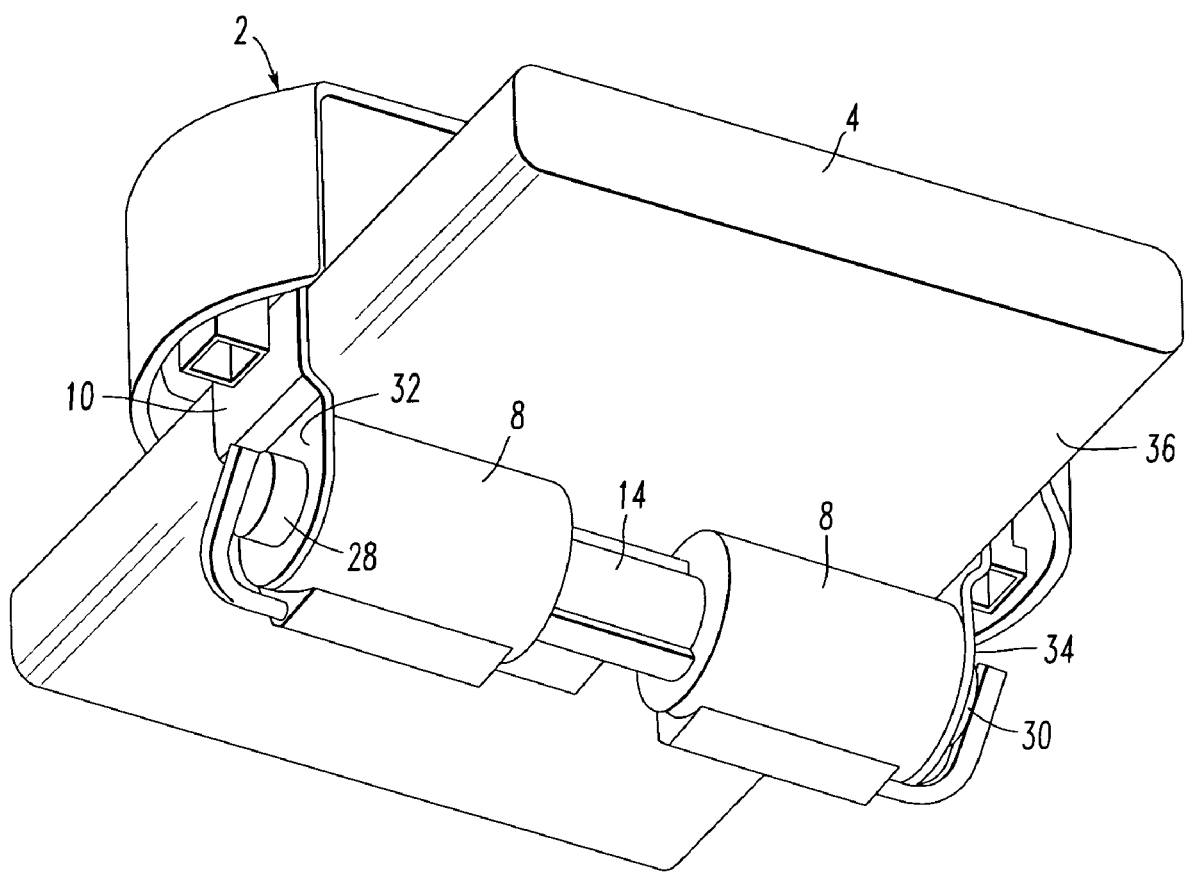
FIG. 5 is an isometric view of the temperature sensor and the two bus coils of FIG. 2.

Referring to FIG. 1, a self-powered wireless power bus temperature sensor device 2 is disposed about a power bus bar 4. The sensor device 2 includes a housing, such as an insulated enclosure 6, and two power coils 8 (only one coil 8 is shown in FIG. 1; two coils 8 are shown in FIGS. 2, 3 and 5). Alternatively, only one coil (not shown) of suitable size need be employed.

Also referring to FIG. 2, the sensor device 2 further includes a magnetic flux concentrator member 10 (e.g., made of cold rolled steel), a ferrite core 12 (e.g., made of a suitable ferrous material), an assembly clip/spacer 14, an electronics board assembly 16, an insulated case 18 (e.g., made of nylon), an insulated cover 20 (e.g., made of nylon), and four insulated screws 22 (e.g., made of nylon).

Alternatively, one or both of the magnetic flux concentrator member 10 and the ferrite core 12 need not be employed. The ferrite core 12 (e.g., magnetic, but suitably low conductivity in order to not heat up as much due to eddy currents) produces relatively lower power loss (e.g., heat) due to AC flux. Alternatively, a suitable laminated structure (e.g., as employed in transformers) may be employed.

As will be explained, below, in connection with FIGS. 3, 5 and 6, a power supply 24 is adapted to couple the housing 6 to a current carrying power bus, such as the power bus bar 4. The power supply 24 includes the two power coils 8 each of which has an opening 26, the ferrite core 12 having two ends 28,30, and the magnetic flux concentrator member 10 having two ends 32 (as shown in FIGS. 3 and 5) and 34. The ferrite core 12 passes through the openings 26 of the power coils 8. The ends 32,34 of the magnetic flux concentrator member 10 engage the respective ends 28,30 of the ferrite core 12. The ferrite core 12 and the magnetic flux concentrator member 10 encircle and capture the power bus bar 4, with the member 10 coupling the case 18 thereto. The common ferrite core 12 and the magnetic flux concentrator member 10 further combine to act as a flux concentrator and, also, hold the sensor device 2 to the power bus bar 4 (as shown in FIGS. 3 and 5). As will be discussed below in connection with FIG. 6, the sensor device 2 uses the two flux sensing power coils 8 and the common inserted ferrite core 12 for improved magnetic flux coupling (e.g., as seen by Faraday's law, $V=IR+d\lambda/dt$, wherein $\lambda$ is flux linkage) to convert the magnetic flux from the power bus bar 4 to a usable voltage source to provide suitable input power for the power supply 24. As a result, the sensor device 2 is self-powered.

Referring to FIG. 3, the power bus bar 4 includes a generally planar surface 36. The common ferrite core 12 and the magnetic flux concentrator member 10 cooperate to hold the power coils 8 against or proximate to the generally planar surface 36. That surface 36 has a first end 38 and an opposite second end 40. The spacer 14 has an opening 42 through which the ferrite core 12 passes. The spacer 14 is disposed between the power coils 8, each of which is adapted to be proximate one of the ends 38,40 of the surface 36.

The sensor device 2 also includes a suitable temperature sensor 44 (e.g., an LM35 precision temperature sensor marketed by National Semiconductor of Santa Clara, Calif.) that is suitably thermally coupled with another generally planar surface 46 of the power bus bar 4. The output of the sensor 44 is electrically input by the electronics board assembly 16, as will be described, below, in connection with FIG. 6.

The sensor device 2 is, thus, designed to fasten itself around the power bus bar 4. This provides two benefits. First, the mechanical position of the temperature sensor 44 on the power bus bar 4 is provided. Second, a relatively better path for magnetic flux to link the power coils 8 as employed for self-power is provided.

EXAMPLE 1

The design of the sensor device 2 fits a power bus bar 4 with suitable cross sectional dimensions (e.g., without limitation, about 3.0 inches xx about 0.5 inches), although a wide range of other power bus dimensions may be employed by employing suitable sizes of the flux concentrator member 10, the ferrite core 12 and the spacer 14.

EXAMPLE 2

A wide range of temperature sensors may be employed. For example, a silicon diode (not shown) may be suitably thermally coupled with or suitably disposed proximate to the surface 46 of the power bus bar 4 for heating thereby. For example, the forward voltage drop across the diode decreases linearly with an increase in the temperature of the power bus bar 4. The forward voltage of the diode as energized by the power supply 24 is electrically input by an electronics board assembly, such as 16.

Although a silicon diode is disclosed, other forward biased PN junctions could be used, such as, for example, gallium arsenide. Alternatively, any suitable active or passive temperature measuring or sensing device (e.g., RTDs (resistive temperature detectors), various metals (e.g., copper, nickel, platinum) having resistance, voltage or current characteristics versus temperature) may be employed.

Figure 4:
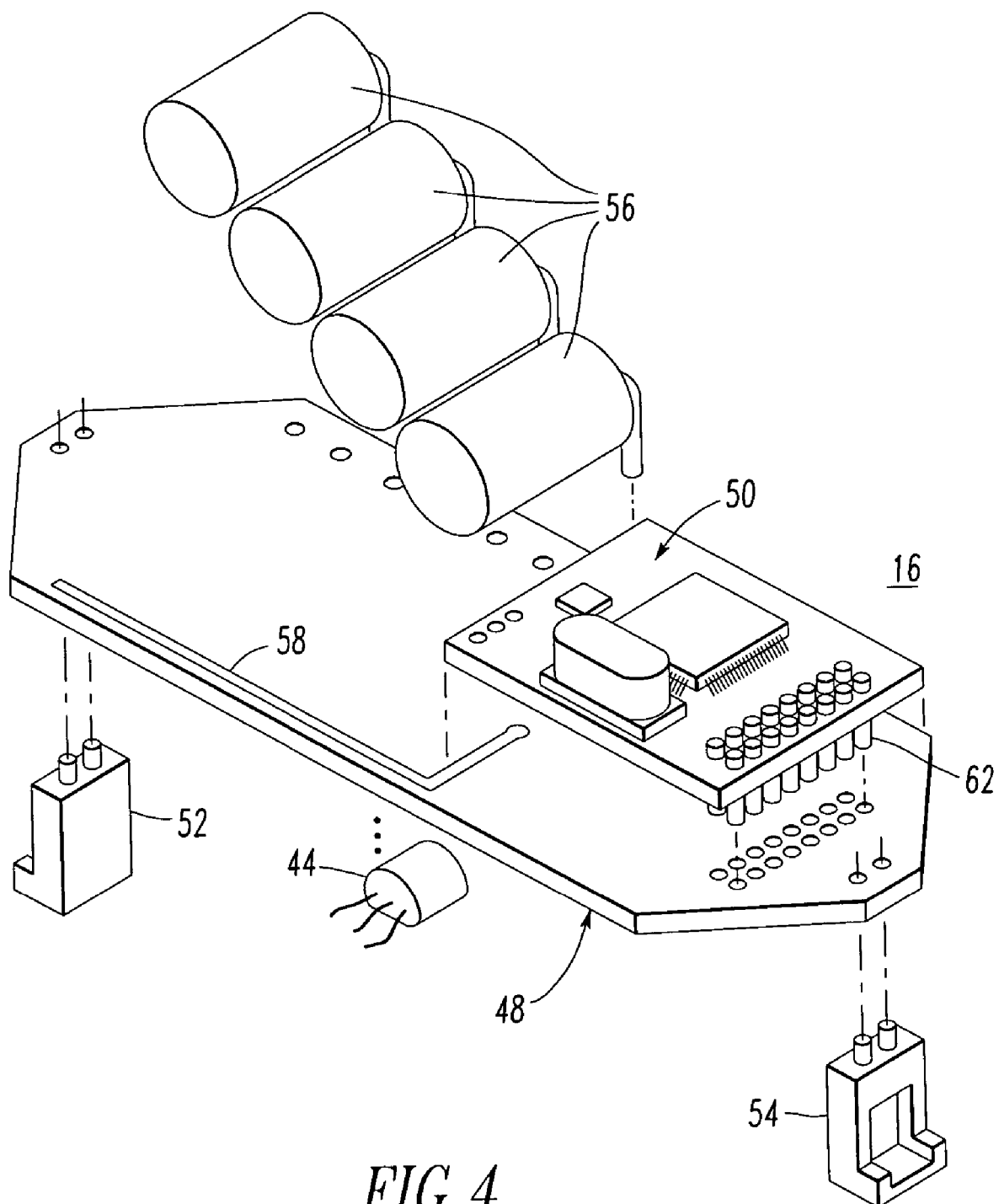
FIG. 4 is an exploded isometric view of the electronics board assembly of FIG. 2.

Referring to FIG. 4, the electronics board assembly 16 is shown. The assembly 16 includes a temperature sense printed circuit board 48, the temperature sensor 44, a radio transceiver printed circuit daughter board 50, two 2-pin board connectors 52,54, and four capacitors 56. Alternatively, any suitable capacitive energy storage configuration (e.g., one or more capacitors or supercaps) may be employed. The radio transceiver daughter board 50 provides wireless communication through a suitable antenna, which is a printed conductor, such as conductive trace 58, on the temperature sense printed circuit board 48.

Figure 6:
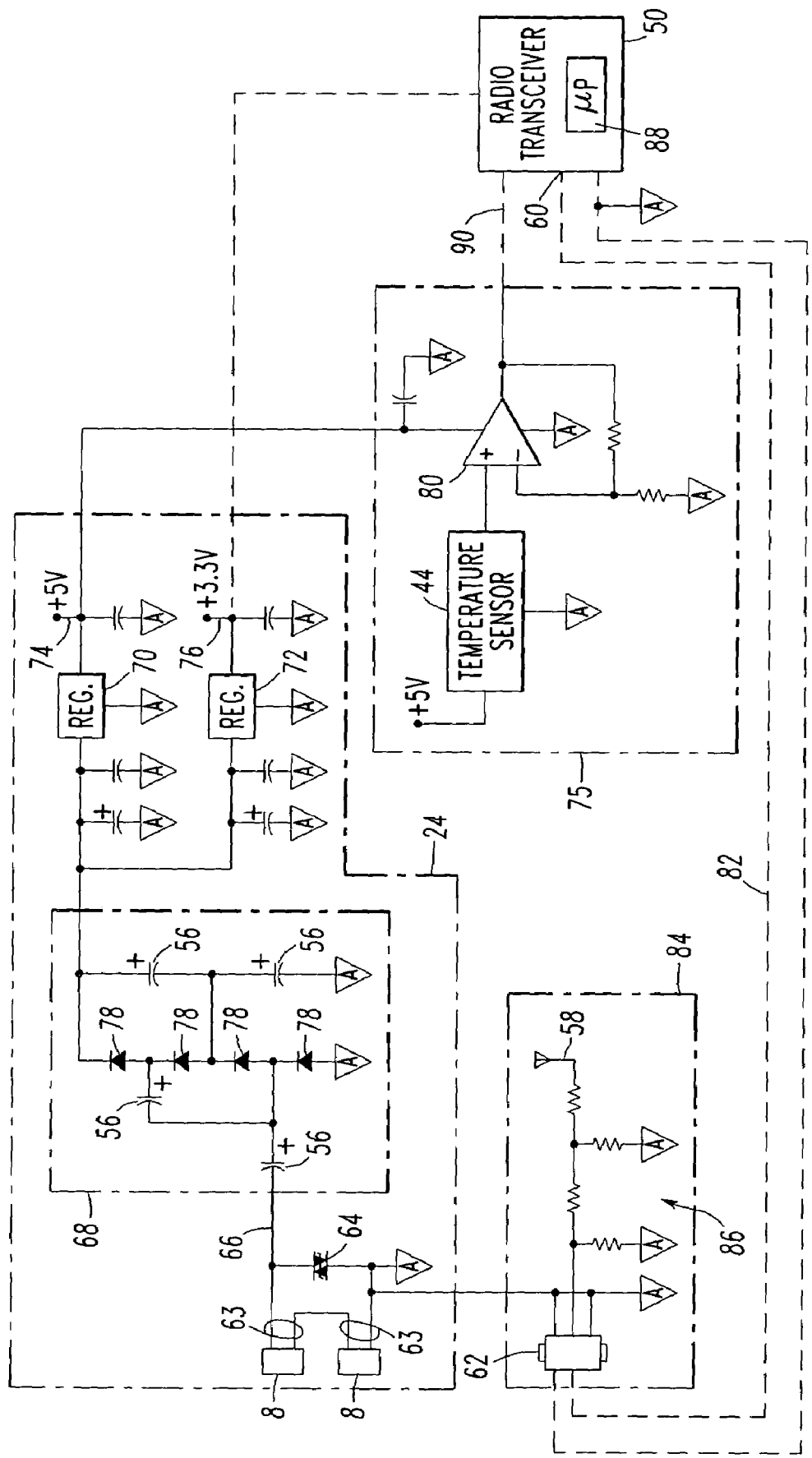
FIG. 6 is a block diagram in schematic form of the electronics board of FIG. 2.

The daughter board 50 includes an antenna output 60 (FIG. 6). The printed circuit board 48 includes a connector 62 (FIGS. 4 and 6) electrically connecting the conductive trace 58 to the antenna output 60.

EXAMPLE 3

The antenna 58 may be a printed circuit board inverted-L antenna with Gamma match. For example, the length of the antenna 58 may be designed for a quarter wave 915 MHz signal.

EXAMPLE 4

As an alternative to Example 3, any suitable antenna may be employed. A wide range of antenna types, communication distances and other frequency designs (e.g., 2.4 GHz) may be employed.

EXAMPLE 5

The radio transceiver daughter board 50 may be, for example, any suitable wireless transmitter or transceiver.

EXAMPLE 6

Although two printed circuit boards 48,50 are shown, a single printed circuit board or other suitable circuit structure may be employed.

EXAMPLE 7

Another example of the radio transceiver daughter board 50 is a Zensys A-Wave FSK radio marketed by Zensys Inc. of Upper Saddle River, N.J.

EXAMPLE 8

Alternatively, any suitable radio circuit (e.g., without limitation, a Zigbee compatible board; a Zigbee compliant transceiver (e.g., http://www.zigbee.org); an IEEE 802.15.4 transmitter or transceiver; a radio board, a radio processor) may be employed.

EXAMPLE 9

Application programs are added to the Zensys radio board of Example 7 to provide application specific communication of temperature information from the temperature sensor 44. For example, features such as sleep mode, how often data is sent, transmit data format and the receipt of acknowledgements or requests for data may be suitably programmed.

FIG. 5 shows the temperature sensor device 2 and the two power coils 8, which are positioned on the lower (with respect to FIG. 5) side of the power bus bar 4. This allows running the flux concentrator member 10 around the power bus bar 4 for producing suitable self-power at appropriate bus current levels.

EXAMPLE 10

As a non-limiting example, at bus current levels of 400 A to 600 A, the power supply 24 of FIG. 6 may regulate +5 VDC and/or +3.3 VDC and provide 30 mA at those bus currents, although relatively lower (e.g., 50 A) or relatively higher (e.g., 1200 A) bus currents may be employed.

Continuing to refer to FIG. 6, the circuitry of the temperature sense printed circuit board 48 of FIG. 4 is shown. Each of the coils 8 includes a winding 63 which is electrically connected in series with the winding of the other coil. The series electrically connected coil windings 63 output a voltage. A suitable transient voltage suppressor 64 is electrically connected across the series combination of the power coils 8 in order to limit the voltage 66 by shunting relatively high current spikes for short durations and relatively low current spikes for relatively longer durations. The coil (alternating current (AC)) voltage 66 is input by a voltage quadruplet circuit 68, which, in turn, outputs a suitable direct current (DC) voltage 69 to two voltage regulators 70 and 72 providing a +5 VDC voltage 74 for a temperature circuit 75 and a +3.3 VDC voltage 76 for the radio transceiver daughter board 50 of FIG. 4. The example circuit 68 includes the four capacitors 56 and four diodes 78 that provide energy storage and rectification, although a wide range of suitable protection and multiplication circuits may be employed.

The temperature circuit 75 includes the temperature sensor 44 and a buffer amplifier 80. The radio transceiver daughter board 50 is adapted to transmit (and/or receive) a wireless signal 82 through a suitable antenna circuit 84. The antenna circuit 84 includes the connector 62, the conductive trace 58 and a suitable matching circuit 86.

The daughter board 50 includes a suitable processor, such as a microprocessor (μP) 88, which inputs the sensed temperature characteristic 90 from the temperature circuit 75 and outputs the corresponding wireless signal 82.

As is discussed below in connection with FIGS. 7-10, power savings may be provided by employing a relatively efficient wireless communication board and/or by employing a processor including appropriate sleep (e.g., low-power) and wake up modes.

EXAMPLE 11

As a non-limiting example, the temperature circuit 75 draws about 5 mA from the +5 VDC voltage 74 and the radio transceiver daughter board 50 draws 40 mA during wireless transmission and 50 mA during reception in which peak power may be supplied by capacitors, such as 56, in the power supply 24 during these relatively short durations of time. Otherwise, the radio transceiver is preferably turned off.

EXAMPLE 12

Figure 7:
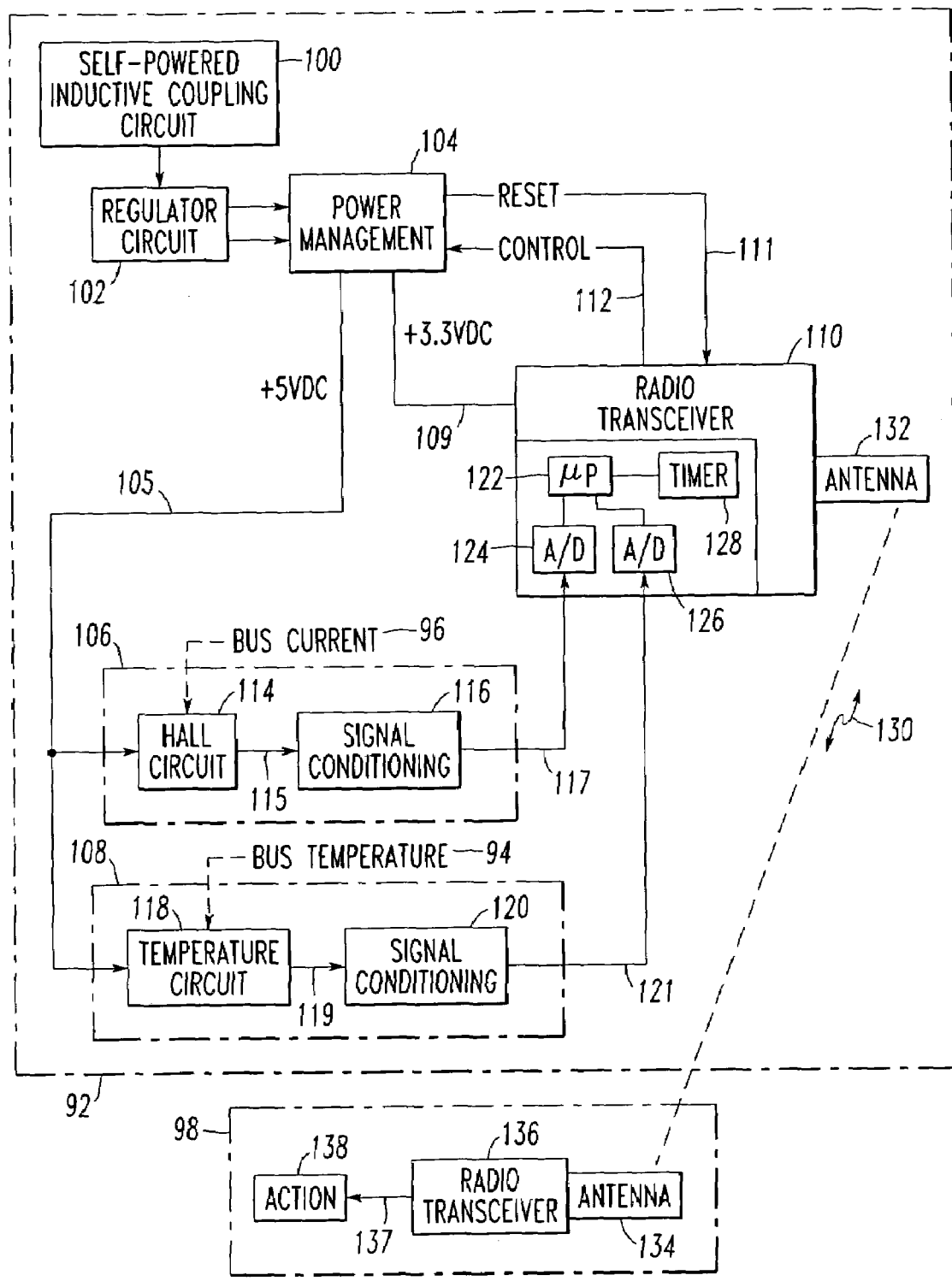
FIG. 7 is a block diagram of another wireless power bus sensor for measuring bus temperature and bus current in accordance with another embodiment of the invention.

FIG. 7 shows another stand-alone wireless power bus sensor 92 for measuring a characteristic of a power bus, such as bus temperature 94 and/or bus current flow 96. The self-powered sensor 92 is independently coupled to a power bus, such as the power bus bar 4 of FIG. 1, and wirelessly communicates the sensed bus temperature 94 and/or the sensed bus current flow 96 to a remote device 98 at a suitable time interval (e.g., without limitation, every few seconds; every few minutes).

The sensor 92 includes a suitable self-powered inductive coupling circuit 100 and a regulator circuit 102 that may function in a similar manner as the power supply 24 of FIGS. 1 and 6. In addition, a power management circuit 104 may be employed to provide the additional functions of: (1) managing a +5 VDC voltage 105 to a current sensing circuit 106 and a temperature sensing circuit 108; (2) managing a +3.3 VDC voltage 109 to a radio transceiver circuit 110; (3) providing a power on reset signal 111 to the radio transceiver circuit 110 whenever the voltages from the regulator circuit 102 are initially established; and/or (4) circuit deactivation to minimize energy consumption.

For example, if a control signal 112 from the radio transceiver circuit 110 is set to one state (e.g., true), then the power management circuit 104 outputs the normal voltages 105 and 109 to the respective circuits 106,108 and 110. Otherwise, the voltage 105 is disabled and the voltage 109 is reduced to a suitable sleep-mode voltage (e.g., without limitation, about 1.0 VDC). In this manner, energy conservation is continuously occurring in order to maintain the charge on the local power supply (e.g., capacitors (not shown)).

Preferably, as is discussed below in connection with FIGS. 8-10, suitable power management routines are employed to help save energy consumption by putting the microprocessor 122 into a sleep (e.g., low-power) mode and waking up when data is to be sent. As a result, this may allow the sensor 92 to self-power at relatively lower bus currents.

EXAMPLE 13

The bus current flow 96 is measured by a suitable current sensor 114 of the current sensing circuit 106. For example, the current in the power bus is measured with one or two appropriately placed Hall sensors (not shown) to measure flux density near the power bus. A flux density signal 115 is suitably conditioned by a signal conditioning circuit 116 and is input at 117 by the radio transceiver 110.

EXAMPLE 14

The bus temperature 94 is measured by a suitable temperature circuit 118 of the temperature sensing circuit 108. The circuit 118 and its signal conditioning circuit 120 may be the same as or similar to the sensors as discussed above in connection with Example 2 and FIG. 6. A temperature signal 119 is suitably conditioned by the signal conditioning circuit 120 and is input at 121 by the radio transceiver 110.

Continuing to refer to FIG. 7, the radio transceiver 110 includes a suitable processor, such as a microprocessor (µP) 122, two analog-to-digital (A/D) converters 124 and 126, which include the respective inputs 117 and 121, and a timer 128, which is adapted to interrupt the processor 122 to wake up from its low-power mode. After initialization (e.g., startup), the microprocessor 122 enters a low power mode. The current and temperature signals at the inputs 117,121 are converted by the A/D converters 124,126, respectively, to corresponding digital signals and are transmitted by the radio transceiver 110 as a wireless signal, such as a low-rate wireless signal 130, from the antenna 132.

EXAMPLE 15

For example, the signal 130 is sent every few minutes in order to conserve energy from the regulator circuit 102.

EXAMPLE 16

The remote device 98 receives the wireless signal 130 through antenna 134 to a corresponding radio transceiver 136, which, in turn, outputs a signal 137 to take a corresponding action 138.

EXAMPLE 17

The action 138 may be a display action adapted to display the sensed characteristic of the power bus.

EXAMPLE 18

The action 138 may be a flag (e.g., alarm) action adapted to alarm the sensed characteristic of the power bus.

EXAMPLE 19

The action 138 may be a wellness action adapted to determine the health of the power bus based upon the sensed characteristic thereof. As a non-limiting example, a suitable diagnostic algorithm, a suitable data mining algorithm or a look-up table (not shown) may be employed to make a calculation on the health of the power bus bar 4 or corresponding switchgear system (not shown) based on recorded historical (e.g., trend) data or known parameters of operation.

EXAMPLE 20

The action 138 may be a trip action adapted to trip a switchgear device (not shown) based upon the sensed characteristic of the power bus.

Figure 8:
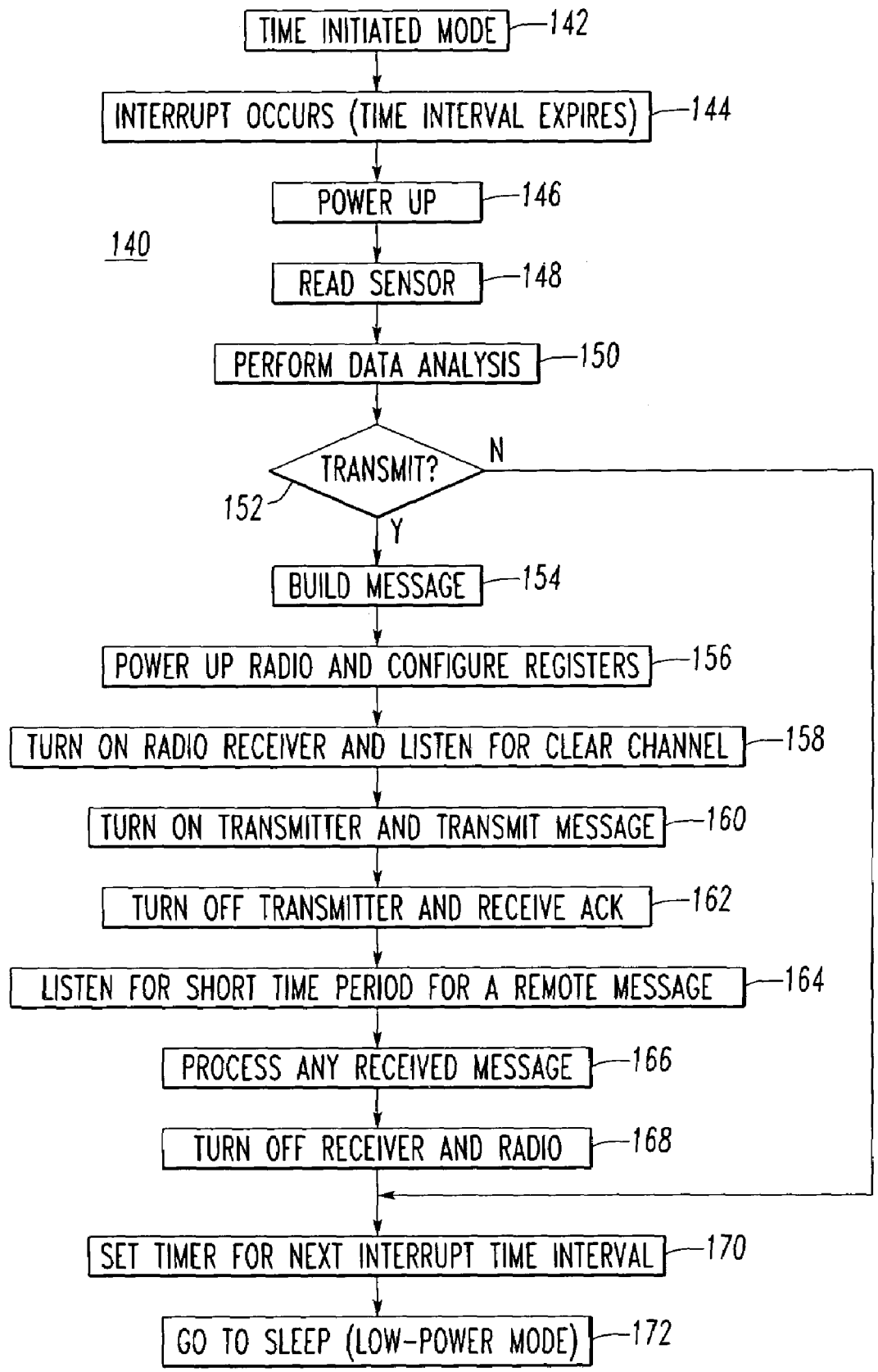
FIGS. 8-10 are flowcharts of software executed by the processor of FIG. 7 in accordance with other embodiments of the invention.

FIG. 8 shows a software routine 140 executed by the microprocessor 122 of FIG. 7, although the same or similar routine may be employed by the microprocessor 88 of FIG. 6. The microprocessor 122 includes a low-power mode and the routine 140 is adapted to wake up from that low-power mode, input the sensed characteristic(s) of the power bus (e.g., the power bus bar 4 of FIG. 1), to prepare a message to output as the corresponding wireless signal 130 of FIG. 7, and, then, to sleep in the low-power mode.

The time initiated mode 142 begins, at 144, when an interrupt to the microprocessor 122 of FIG. 7 occurs after the time interval of the timer 128 expires. In response, at 146, the microprocessor 122 wakes up from the low-power mode. Next, at 148, the sensed characteristic(s) of the power bus is (are) read (e.g., from the A/D converters 124,126). Then, at 150, suitable data analysis may be performed on the sensed bus characteristic(s). For example, the raw sensor data may be converted to temperature (e.g., ° C.; ° F.) values or current (e.g., A) values and/or the state of health of the power bus may be performed based on a suitable diagnostic algorithm (not shown) and historic data collection and/or the temperature or current values may be compared to preset limit values (not shown). Next, at 152, a decision is made whether to transmit. For example, this decision could always be yes (e.g., the duty cycle for the low-power sleep mode versus transmitting a message is low enough in order that energy consumption is less than the total energy harvested between interrupt intervals), could be based upon the magnitude of change or the value of the bus characteristic(s), and/or could be based upon whether sufficient power supply voltage is present. If not, then execution resumes at 170. Otherwise, execution resumes at 154, which builds a suitable message frame (not shown) for transmission. Then, at 156, the microprocessor 122 powers up the radio (not shown) of the radio transceiver 110 and configures the registers (not shown) thereof. Next, at 158, the radio receiver (not shown) is turned on and a suitable clear channel is awaited. Then, at 160, the radio transmitter (not shown) is turned on and the message frame is transmitted as the wireless signal 130. Next, at 162, the radio transmitter is turned off and an acknowledge message (not shown) is received from the recipient of that wireless signal 130. Next, at 164, the radio receiver is checked for any remote message (not shown), which, if received, is processed at 166. Then, at 168, the radio receiver and the radio are turned off. Next, at 170, the timer 128 is reset for the next interrupt time interval. Finally, at 172, the microprocessor 122 powers down and enters the low-power sleep mode.

Figure 9:
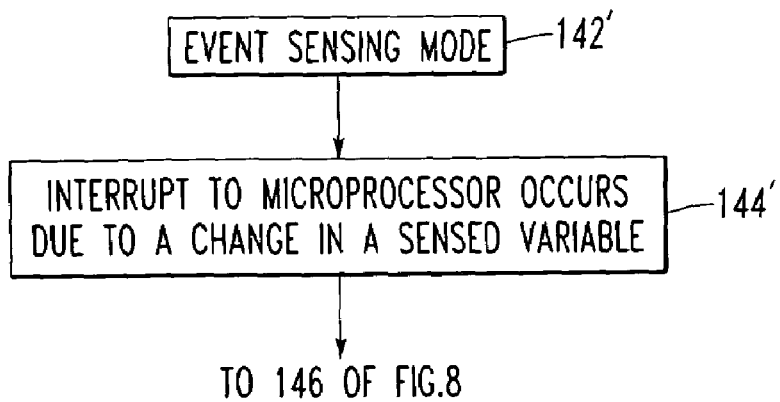

FIG. 9 shows a software routine 180 executed by the microprocessor 122 of FIG. 7, although the same or similar routine may be employed by the microprocessor 88 of FIG. 6. The microprocessor 122 includes an event sensing mode 142' that initiates the interrupt of step 144 of FIG. 8 instead of the timer 128, which need not be employed. At 144', the interrupt to microprocessor 122 occurs as a result of a suitably significant change (Δ) in a sensed variable (e.g., Δ temperature from the temperature sensing circuit 108; Δ current from the current sensing circuit 106; Δ sensed variable from any suitable bus characteristic sensor; Δ power supply voltage from the regulator circuit 102). Thus, a significant change in one or more of the sensed bus characteristic(s) or a significant increase of the power supply voltage(s) may trigger the transmission of the wireless signal 130. For example, these changes may be determined by one or more of the circuits 104,116,120 and may be input by the microprocessor 122 on one or more interrupt lines (not shown). Regardless, this causes the microprocessor 122 to wake up and power up as was discussed above in connection with step 146 of FIG. 8. Execution is otherwise similar to even steps 146-172 of FIG. 8 except that steps 152 and 170 are not employed.

Preferably, one of the routines 140 of FIG. 8 and 180 of FIG. 9 is employed to provide relatively low energy consumption from the regulator circuit 102 of FIG. 7.

Figure 10:
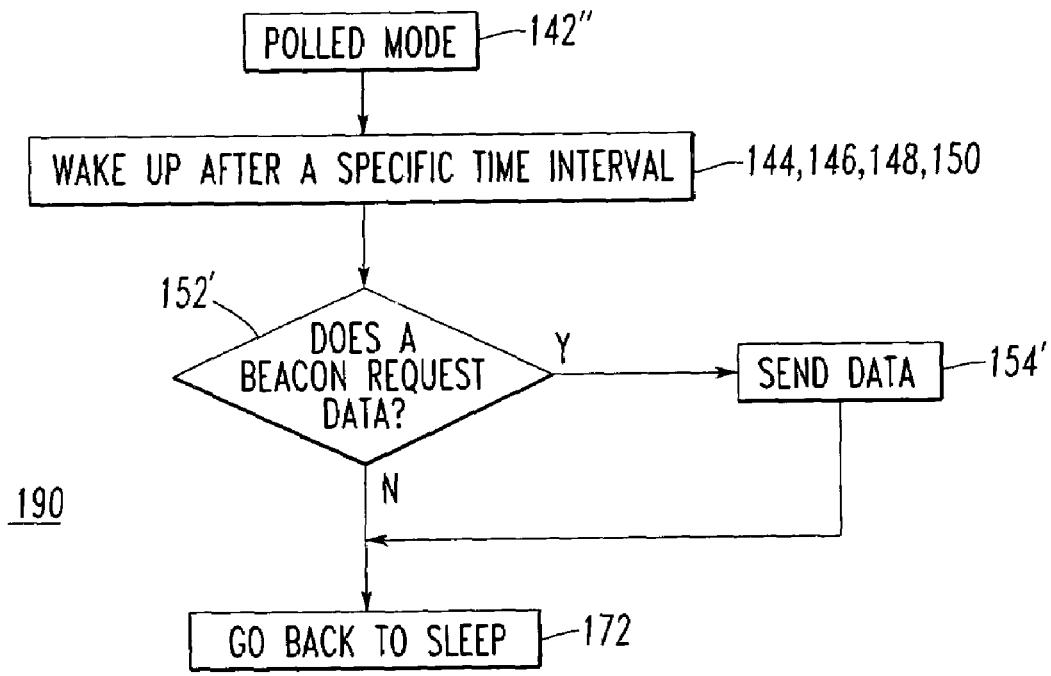

FIG. 10 shows a software routine 190 executed by the microprocessor 122 of FIG. 7, although the same or similar routine may be employed by the microprocessor 88 of FIG. 6. The microprocessor 122 includes a polled mode 142" that includes even steps 144,146,148,150 of FIG. 8 that wake up after the predetermined time interval and read the sensed bus characteristic(s). However, no wireless signal is transmitted unless it is requested by a remote device (e.g., 98 of FIG. 7). Next, step 152' determines whether a received message, such as a beacon message (e.g., employed to trigger a response from another wireless device) requests data. For example, step 152' may include even steps 156,158,164,166,168 of FIG. 8 to receive the message and determine if it requests the transmission of the wireless signal 130. If so, at 154', which employs even steps 154,156,158,160,162 of FIG. 7, the wireless signal 130 is transmitted. Here, the routine 190 causes the microprocessor 122 to wake up after a specific time interval and to listen for a beacon requesting data before sending the wireless signal 130. Otherwise, if there was no request at 152', or after 154', the routine 190 goes back to sleep and checks for another beacon at the end of the next time interval.

EXAMPLE 21

Examples 7-9, above, cover relatively short range RF "meshed networking" (e.g., without limitation, Zigbee compatible; Zigbee compliant; IEEE 802.15.4; ZensysT; Z-WaveT; Zensys) technology, while other applications may employ an automobile-style remote keyless entry (RKE) frequency shift keying (FSK) RF master/slave technology. The difference between these technologies is that nodes using meshing technology may have relatively longer periods (e.g., relatively higher duty cycle) of relatively "high" energy consumption during which the processor and radio are on. In contrast, the RKE FSK RF technology employs a relatively short, single FSK RF burst signal from a slave node, which assumes that a master node is always awake and ready to receive the FSK RF burst signal. As such, a different power supply, such as 24' of FIGS. 11 and 12, may be employed.

Figure 11:
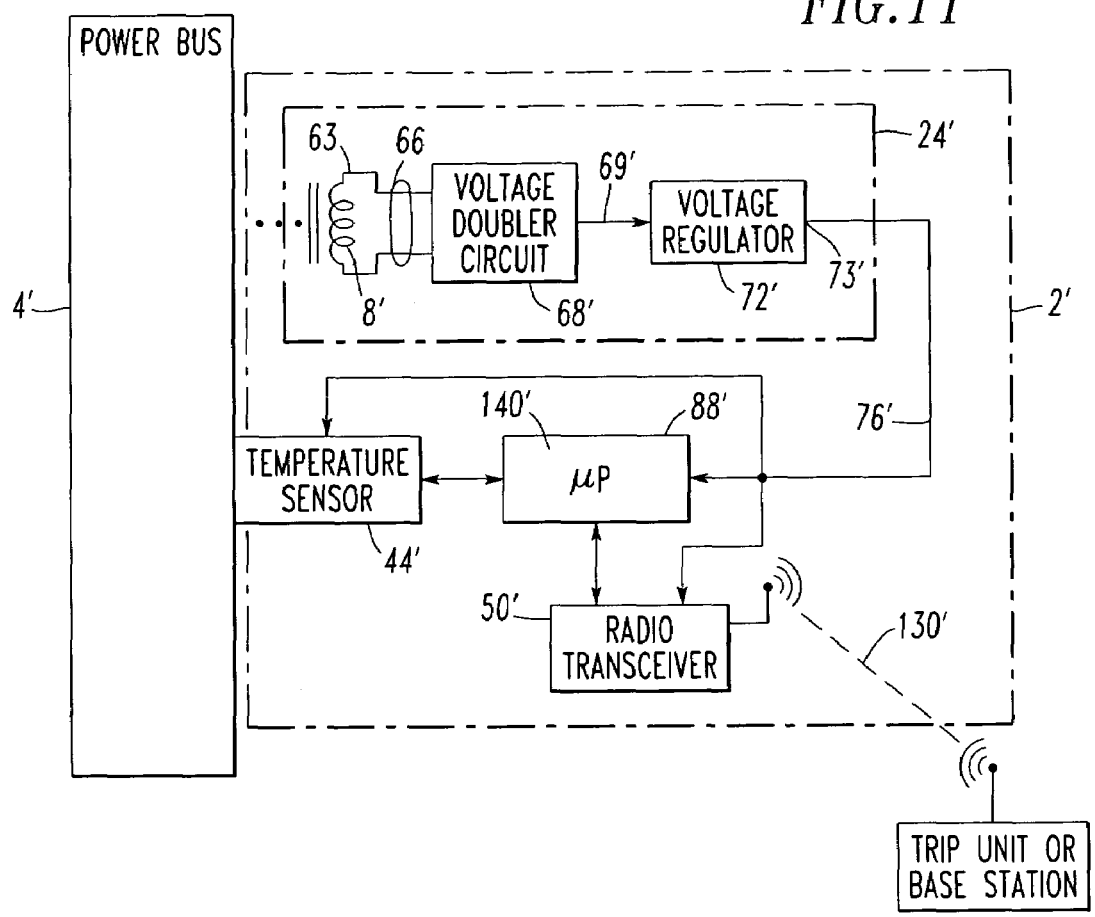
FIG. 11 is a block diagram of another wireless power bus sensor for measuring bus temperature in accordance with another embodiment of the invention.

FIG. 11 shows another wireless power bus sensor 2' for measuring bus temperature. A processor 88' includes a low-power mode and a routine 140' adapted to wake up from the low-power mode, to input the sensed temperature characteristic of power bus 4' from one or more sensors, such as temperature sensor 44', to output a corresponding signal to the radio transceiver 50' to transmit as a wireless signal 130', and to sleep in the low-power mode. The power supply 24' is adapted to power the sensor(s) 44', the radio transceiver 50' and the processor 88' from flux arising from current flowing in the power bus 4'. The power supply 24' includes one or more voltages, such as 76'. The processor 88' is adapted to perform a power on initialization at 204 (FIG. 13) and execute code in response to a predetermined value (e.g., at least about 2.8 VDC) of the voltage(s) 76'.

Figure 12:
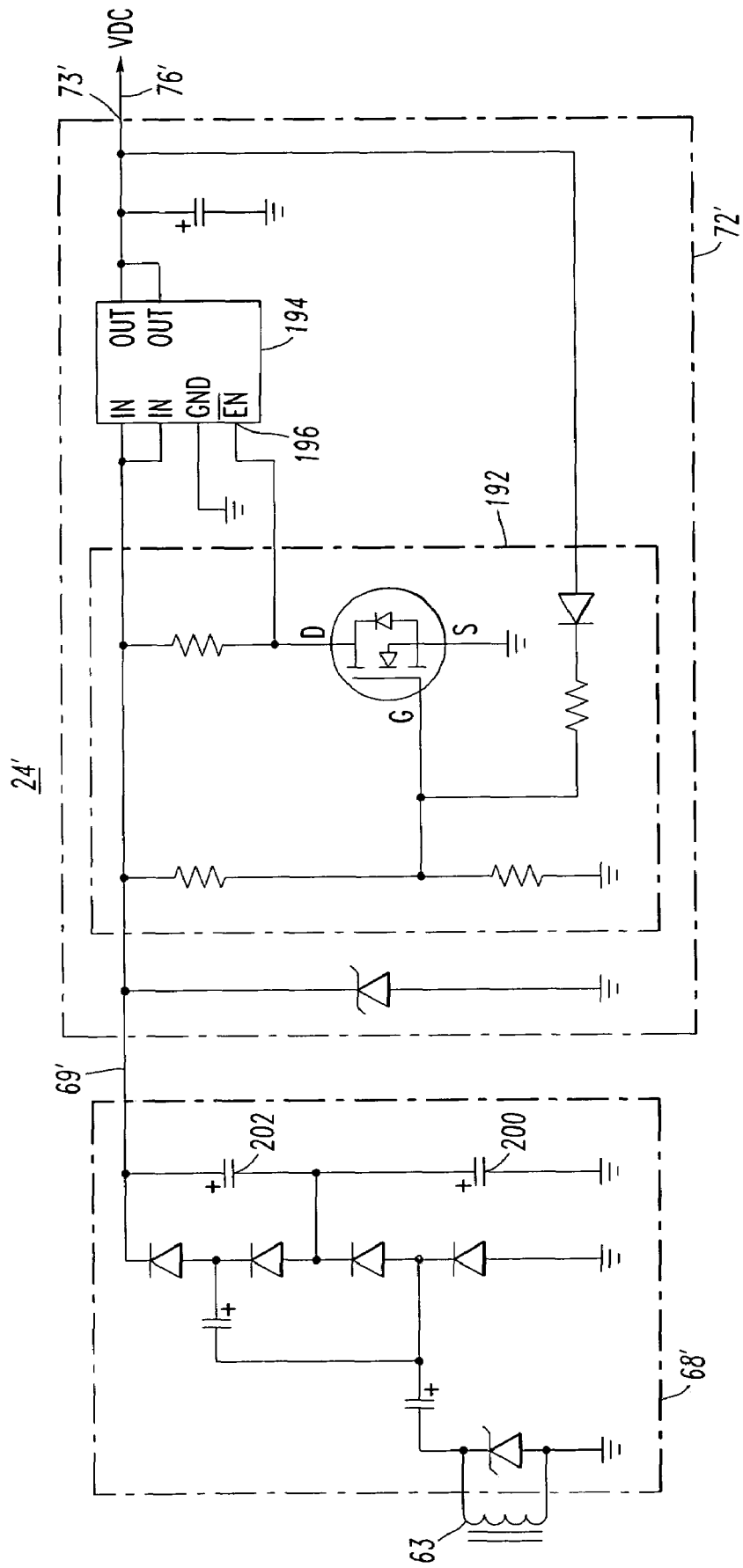
FIG. 12 is a block diagram in schematic form of the power supply of FIG. 11.

The power supply 24' includes a coil 8' having an output 63 with an alternating current voltage 66, a voltage multiplier circuit, such as a voltage doubler circuit 68', having an input electrically interconnected with the coil output 63 and an output with a direct current voltage 69', and a voltage regulator 72' having at least one output 73' with the at least one voltage 76'. As shown in FIG. 12, the power supply voltage regulator 72' includes a circuit 192 adapted to monitor the direct current voltage 69' and disable a voltage regulator circuit 194 when the direct current voltage 69' is below a predetermined value (e.g., without limitation, 3.5 VDC). Otherwise, the EN/(enable) input 196 of the voltage regulator circuit 194 is pulled low to enable the same to source the voltage 76'.

Figure 13:
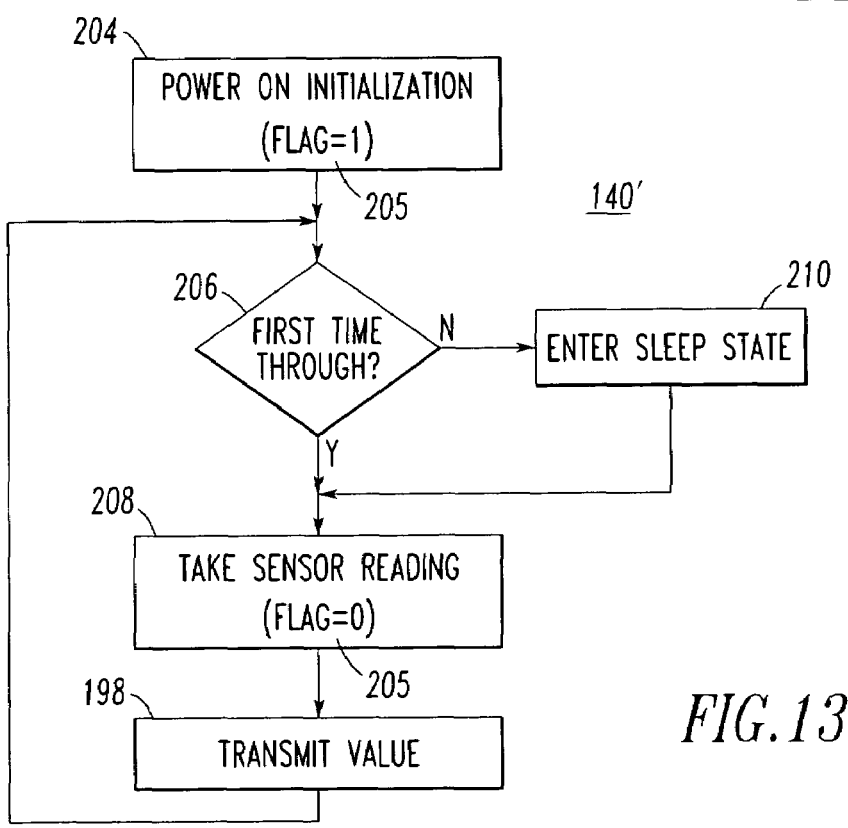
FIG. 13 is a flowchart of software executed by the processor of FIG. 11.

FIG. 13 shows the routine 140' executed by the processor 88' of FIG. 11. The processor software, such as routine 140', may conclude that the sensor 2', which is a slave node, is going to sleep after a transmission, or alternately, as is discussed below in connection with Example 23, may monitor its power supply 24' and, similar to a brown out function, turn off when power is too low to maintain operation. FIG. 13 shows the example where the processor 88' goes to sleep, at 210, after each transmission, at 198. In turn, the processor 88' wakes up after an internal time period has elapsed. The circuit 192 of FIG. 12 ensures that the charge (i.e., Q=CV) of the capacitors 200,202 (FIG. 12) is sufficiently large, such that the DC voltage 69' is suitably maintained to support at least one maximum length transmission of the wireless signal 130' (FIG. 11).

The routine 140' first determines a power on initialization state of the processor 88' at 204 and sets a flag 205. If the flag 205 is set at 206, then execution resumes at 208, which responsively inputs the sensed temperature characteristic of the power bus 4' from the sensor 44'. This step also clears the flag 205. Next, at 198, the routine 140' outputs a signal to the radio transceiver 50' to transmit as the wireless signal 130' before sleeping in the low-power mode, at 210, since the flag 205 is now reset. Otherwise, for subsequent iterations of the routine 140', the processor 88' sleeps in the low-power mode at 210 before inputting a sensed temperature characteristic of the power bus 4' from the sensor 44' and outputting the signal to the radio transceiver 50' to transmit as the wireless signal 130' before sleeping again in the low-power mode at 210.

The processor 88' is preferably adapted to wake up from the low-power mode, at 210, after an internal timer (not shown) has elapsed.

In this example of FIG. 13, the routine 140' is adapted to sleep in the low-power mode, at 210, after (a) waking up from the low-power mode to take a sensor reading at 208, and after (b) outputting, at 198, to the radio transceiver 50' to transmit the single wireless signal 130'.

EXAMPLE 22

As an alternative to Example 21 and FIG. 13, where the power supply 24' is relatively more robust, or where the power output needs are relatively less, the processor 88' may go to sleep after two or more transmissions of two or more wireless signals.

EXAMPLE 23

As an alternative to Examples 21 and 22, where the power supply 24' cannot provide, for example, at least about 2.8 VDC continuously, circuit 192 will disable the voltage regulator 194 resulting in the processor 88' powering down. When the DC voltage 69' (FIG. 12) is above a suitable predetermined value, the processor 88' will then enter the power on initialization (204 of FIG. 13) and execute code. The number of transmissions, in this case, will depend on the rate of charge of the capacitors 200,202.

EXAMPLE 24

Alternatively, as a more specific example of Example 22, the routine 140' may be adapted to sleep in the low-power mode, at 210, after (a) waking up from the low-power mode to take a sensor reading at 208, after (b) inputting a first sensed temperature characteristic of the power bus 4' from the sensor 44' at 208, after (c) outputting a first corresponding signal to the radio transceiver 50' to transmit as a first wireless signal 130', after (d) inputting a second sensed temperature characteristic of the power bus 44' from the sensor 44', and after (e) outputting a second corresponding signal to the radio transceiver 50' to transmit as a second wireless signal 130'.

Although the radio transceivers 50,110,50' employ respective processors 88,122,88' it will be appreciated that a combination of one or more of analog, digital and/or processor-based circuits may be employed.

While for clarity of disclosure reference has been made herein to the exemplary display action 138 for displaying temperature, current or other sensor information, it will be appreciated that such information may be stored, printed on hard copy, be computer modified, or be combined with other data. All such processing shall be deemed to fall within the terms "display" or "displaying" as employed herein.

The disclosed sensor devices 2,2' are relatively easy to install for new or retrofit applications, since they can be placed on the respective power bus bars 4,4'.

While specific embodiments of the inventions have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. A sensor apparatus for a power bus including a plurality of characteristics, said sensor apparatus comprising:

a housing;

at least one sensor, each of said at least one sensor being adapted to sense a characteristic of said power bus;

a circuit adapted to at least transmit a wireless signal;

a processor comprising a low-power mode and a routine adapted to wake up from said low-power mode, to input said sensed characteristic of said power bus from said at least one sensor, to output a corresponding signal to said circuit to transmit as said wireless signal, and to sleep in said low-power mode; and a power supply adapted to power said at least one sensor, said circuit and said processor from flux arising from current flowing in said power bus, said power supply including at least one voltage, wherein said routine is further adapted to determine a power on initialization state of said processor and to responsively input said sensed characteristic of said power bus from said at least one sensor and output said corresponding signal to said circuit to transmit as said wireless signal before sleeping in said low-power mode, and, otherwise, to sleep in said low-power mode before inputting said sensed characteristic of said power bus from said at least one sensor and outputting said corresponding signal to said circuit to transmit as said wireless signal before sleeping again in said low-power mode.

2. The sensor apparatus of claim 1 wherein said power supply further comprises a circuit adapted to monitor said output having the direct current voltage and disable said voltage regulator when said direct current voltage is below a predetermined value; and wherein said processor is adapted to wake up from said low-power mode after a predetermined time interval.

3. A sensor apparatus for a power bus including a plurality of characteristics, said sensor apparatus comprising:
- a housing;
- at least one sensor, each of said at least one sensor being adapted to sense a characteristic of said power bus;
- a circuit adapted to at least transmit a wireless signal;
- processor comprising a low-power mode and a routine adapted to wake up from said low-power mode, to input said sensed characteristic of said power bus from said at least one sensor, to output a corresponding signal to said circuit to transmit as said wireless signal, and to sleep in said low-power mode; and
- a power supply adapted to power said at least one sensor, said circuit and said processor from flux arising from current flowing in said power bus, said power supply including at least one voltage, wherein said routine is further adapted to sleep in said low-power made after waking up from said low-power mode, after inputting a first sensed characteristic of said power bus from said at least one sensor, after outputting a first corresponding signal to said circuit to transmit as a first wireless signal, after inputting a second sensed characteristic of said power bus from said at least one sensor, and after outputting a second corresponding signal to said circuit to transmit as a second wireless signal.

* * * * *